United States Patent
Ji et al.

(10) Patent No.: US 8,359,526 B2
(45) Date of Patent: Jan. 22, 2013

(54) APPARATUS FOR PROCESSING STREAMS AND METHOD THEREOF

(75) Inventors: Kum-ran Ji, Seoul (KR); Yong-deok Chang, Suwon-si (KR); Chan-sub Park, Incheon (KR); Jung-pil Yu, Suwon-si (KR); Hae-joo Jeong, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 385 days.

(21) Appl. No.: 12/667,776

(22) PCT Filed: Jul. 7, 2008

(86) PCT No.: PCT/KR2008/003991
§ 371 (c)(1),
(2), (4) Date: Jan. 5, 2010

(87) PCT Pub. No.: WO2009/005332
PCT Pub. Date: Jan. 8, 2009

(65) Prior Publication Data
US 2010/0325517 A1    Dec. 23, 2010

Related U.S. Application Data

(60) Provisional application No. 60/948,081, filed on Jul. 5, 2007.

(51) Int. Cl.
*H03M 13/00* (2006.01)
(52) U.S. Cl. ........................................................ 714/784
(58) Field of Classification Search ................... 714/784
See application file for complete search history.

(56) References Cited

U.S. PATENT DOCUMENTS

| | | | |
|---|---|---|---|
| 6,917,655 B2 | 7/2005 | Fimoff et al. | |
| 7,823,052 B2 * | 10/2010 | Yu et al. | 714/784 |
| 8,042,019 B2 * | 10/2011 | Choi et al. | 714/758 |
| 2002/0194570 A1 | 12/2002 | Birru et al. | |
| 2005/0249301 A1 * | 11/2005 | Jeong et al. | 375/265 |
| 2008/0267307 A1 * | 10/2008 | Chang et al. | 375/265 |
| 2009/0116580 A1 * | 5/2009 | Park et al. | 375/295 |
| 2011/0214036 A1 * | 9/2011 | Kang et al. | 714/776 |

FOREIGN PATENT DOCUMENTS

KR    10-0667329 A    1/2007

* cited by examiner

*Primary Examiner* — Yolanda L Wilson
(74) *Attorney, Agent, or Firm* — Sughrue Mion, PLLC

(57) ABSTRACT

An apparatus for processing streams includes a trellis encoding unit which changes a part of streams with parities, an RS re-encoding unit which corrects at least one of parity part and data part of the streams, and generates new codewords to match the changed part of the streams, and a multiplexer which re-constructs the streams with the generated codewords.

20 Claims, 5 Drawing Sheets

APPARATUS FOR PROCESSING STREAMS AND METHOD THEREOF

CROSS REFERENCE TO RELATED APPLICATIONS

This application is a National Stage of International Application No. PCT/KR2008/003991 filed Jul. 7, 2008 which claims priority to U.S. Provisional Patent Application No. 60/948,081 filed on Jul. 5, 2007, in the United States Patent and Trademark Office, the disclosures of both of which are incorporated herein in their entirety by reference.

BACKGROUND

1. Technical Field

Apparatuses and methods consistent with the present invention relate to processing streams, and more particularly to an apparatus for processing streams to compensate for streams changing due to trellis-resetting, and a method thereof.

2. Background Art

There are several digital broadcasting standards, such as the U.S.-oriented Advanced Television Systems Committee (ATSC) standard and the European-oriented Digital Video Broadcasting-Handheld (DVB-H) standard.

The U.S.-oriented ATSC standard is based on the National Television Systems Committee (NTSC) frequency band, and facilitates implementation of transceivers and has high economic efficiency. The U.S.-oriented ATSC standard employs a single carrier amplitude modulation Vestigial Sideband (VSB) scheme, so it is possible to transmit high quality video, audio and supplementary data within a single 6 MHz frequency.

As wireless communication apparatuses have developed and become increasingly widespread, attempts have been made to provide digital broadcasting services even when wireless communication apparatuses are moving, in contrast with a conventional digital broadcast transmitting and receiving system.

Therefore, there is a need to support digital broadcasting services more effectively and stably while maintaining compatibility with conventional systems.

SUMMARY

Apparatuses and methods consistent with the present invention provide an apparatus for processing streams and a method thereof to provide digital broadcasting services while maintaining compatibility with conventional digital broadcast transmitting and receiving systems.

According to one aspect, exemplary embodiments provide an apparatus for processing streams, the apparatus including a trellis encoding unit which changes part of a stream with parities; a Reed-Solomon (RS) re-encoding unit which corrects at least one of a parity and data following the changed part of the stream, and generates a new codeword matching the changed part of the stream; and a multiplexer (MUX) which re-constructs the stream using the generated codeword.

The RS re-encoding unit may generate the codeword, in which data and parity are matched to each other, using an erasure decoding algorithm.

If the parity is disposed in front of the changed part of the stream, the RS re-encoding unit may correct part or all of the data following the changed part of the stream.

If the data is disposed in front of the changed part of the stream, the RS re-encoding unit may correct part or all of the parity following the changed part of the stream.

If the parity is disposed in front of and behind the changed part of the stream, the RS re-encoding unit may correct the parity and data following the changed part of the stream, and generate a codeword in which whole data and whole parity are matched to each other.

The RS re-encoding unit may correct at least one of the parity and data of the stream according to position information received from an external source or position information obtained by the RS re-encoding unit, and may generate the new codeword.

Accordingly, the stream may include known data.

The apparatus may further include an RS encoder which performs RS encoding on a stream; and an interleaver which performs interleaving on the RS-encoded stream and transfers the interleaved stream to the trellis encoding unit. In this situation, the RS re-encoding unit may generate the codeword to match the RS encoder.

The MUX may transfer the stream output from the interleaver to the trellis encoding unit. If the stream is changed, the MUX may replace a changed part of the stream with corresponding data of the generated codeword.

According to another aspect, there is provided a method for processing streams for transmission, the method including changing a part of a stream with parities; correcting at least one of a parity and data following the changed part of the stream, and generating a new codeword matching the changed part of the stream; and re-constructing the stream using the generated codeword.

The correcting and generating operation may include generating the codeword, in which data and parity are matched to each other, using an erasure decoding algorithm.

The correcting and generating operation may include, if the parity is disposed in front of the changed part of the stream, correcting part or all of the data part following the changed part of the stream and generating the new codeword matching an RS encoder.

The correcting and generating operation may include, if the data is disposed in front of the changed part of the stream, correcting part or all of the parity part following the changed part of the stream and generating the new codeword matching an RS encoder.

The correcting and generating operation may include, if the parity is disposed in front of and behind the changed part of the stream, correcting the parity and data following the changed part of the stream, and generating the new codeword matching an RS encoder.

The correcting and generating operation may include correcting at least one of the parity and data of the stream according to position information received from an external source or position information obtained by an apparatus for processing streams, and generating the new codeword.

Accordingly, the stream may include known data.

The method may further include performing Reed-Solomon (RS) encoding on a stream by an RS encoder; and performing interleaving on the RS-encoded stream. In this situation, the correcting and generating operation may include generating the codeword to match the RS encoder.

The re-constructing operation may include, if the stream is changed, replacing part or all of a changed part of the stream with the generated codeword.

In the apparatus for processing streams and method thereof according to exemplary embodiments of the present invention, if some areas of a stream are changed after RS encoding is performed, data or parity areas of the stream are corrected and new codewords are generated, so that it is possible to match the data area to the parity area.

DESCRIPTION OF THE EXEMPLARY EMBODIMENTS

Hereinafter, exemplary embodiments of the present invention will be described in detail with reference to the accompanying figures.

Figure 1:
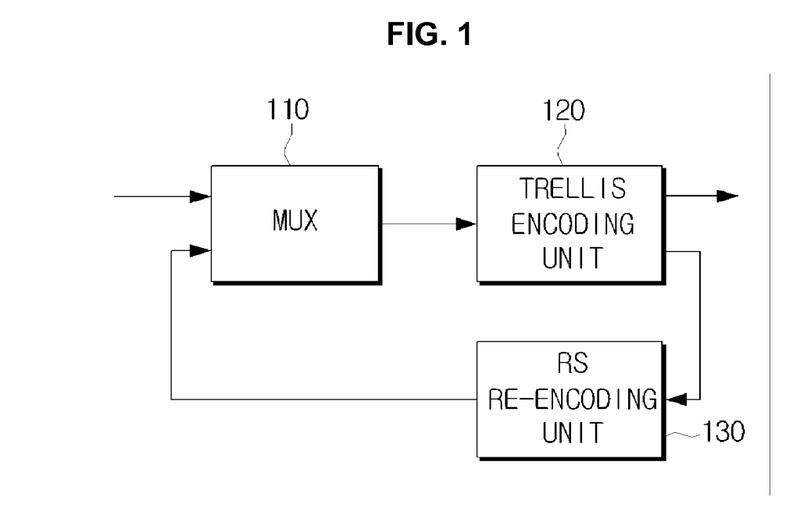
FIG. 1 is a block diagram of a stream processing apparatus according to an exemplary embodiment.

FIG. 1 is a block diagram of a stream processing apparatus according to an exemplary embodiment. The stream processing apparatus of FIG. 1 includes a multiplexer (MUX) 110, a trellis encoding unit 120 and a Reed-Solomon (RS) re-encoding unit 130.

The MUX 110 transfers streams received from a front side to the trellis encoding unit 120. The trellis encoding unit 120 performs trellis-encoding on the received streams. The trellis encoding unit 120 performs trellis-resetting to initialize internal memories using pre-set values at an appropriate time before the trellis-encoding operation, so some streams may change.

According to the trellis-resetting, the RS re-encoding unit 130 generates new codewords, and transfers the new codewords to the MUX 110. The MUX 110 reconstructs the streams using the new codewords. In other words, if parity or data areas of the streams are changed due to the trellis-resetting, the MUX 110 may re-construct new streams, in which the whole parity and whole data are matched to each other, using a parity or data changed according to a change in the areas of the streams.

In more detail, the stream processing apparatus of FIG. 1 may be implemented as a digital broadcast transmitter. The stream processing apparatus of FIG. 1 may process streams including data streams transceived in a conventional digital broadcasting system, namely normal data streams, and may also process additional data streams which are robust against errors, or known data which are shared by a receiver. Known data are training sequences such as supplementary reference signals (SRS).

The MUX 110 may operate in either a first operation mode to perform trellis-encoding on streams received from an external source, or a second operation mode to perform trellis-encoding on at least one part of the new codewords output from the RS re-encoding unit 130. A codeword refers to a single stream unit including a data unit and a parity area corresponding to the data unit.

Here, the stream received by the MUX 110 may be a stream to which a parity area is added by RS-encoding by an RS encoder (not shown) disposed in front of the MUX 110, and which is interleaved by an interleaver (not shown).

The MUX 110 may be operated in either the first operation mode or second operation mode according to a control signal input to the MUX 110. The MUX 110 may receive the control signal from the RS re-encoding unit 130 or from extra channels.

In the first operation mode, the MUX 110 may transfer received streams to the trellis encoding unit 120. Additionally, in the second operation mode, the MUX 110 may transfer streams output from the RS re-encoding unit 130 to the trellis encoding unit 120.

The trellis encoding unit 120 performs trellis-encoding on the streams received from the MUX 110, according to the control signal.

Figure 2:
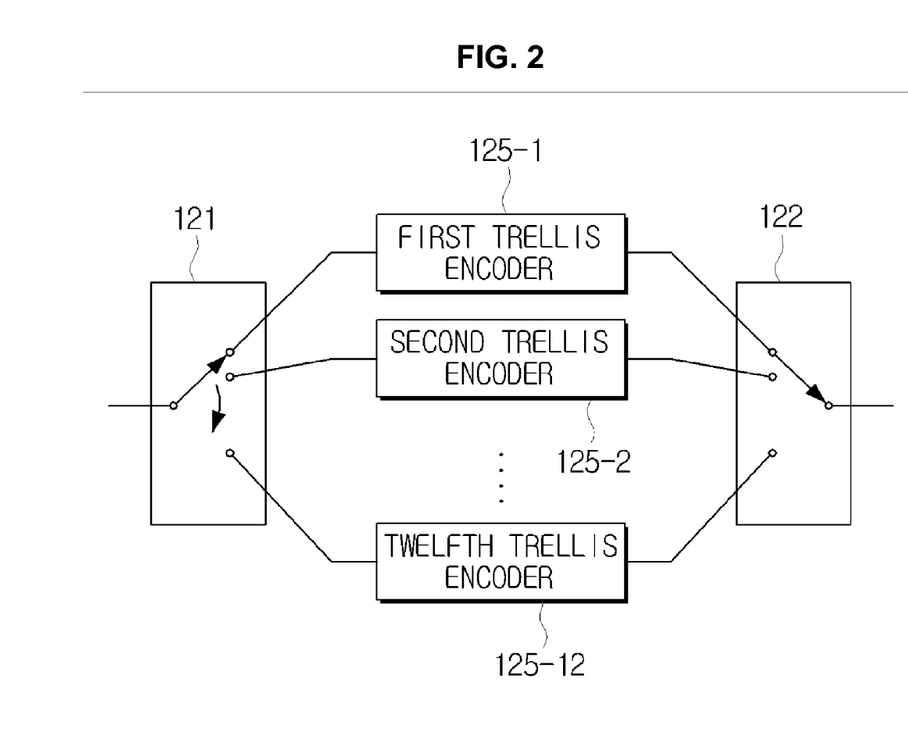
FIG. 2 illustrates an example of a trellis encoding unit in the stream processing apparatus of FIG. 1.

FIG. 2 illustrates an example of a trellis encoding unit 120. The trellis encoding unit 120 includes an input unit 121, a plurality of trellis encoders 125-1 to 125-12, and an output unit 122. The total number of trellis encoders 125-1 to 125-12 is twelve.

The input unit 121 splits a stream by a certain unit (for example, a byte unit), and outputs the split streams sequentially to the first to twelfth trellis encoders 125-1 to 125-12.

Each of the first to twelfth trellis encoders 125-1 to 125-12 includes a plurality of internal memories disposed therein, and performs trellis-encoding on received data using the plurality of internal memories.

The output unit 122 combines the output of the first to twelfth trellis encoders 125-1 to 125-12, and outputs the combined output to the rear side. The input unit 121 and output unit 122 switch the first to twelfth trellis encoders 125-1 to 125-12 sequentially, so that the first to twelfth trellis encoders 125-1 to 125-12 perform trellis-encoding on the streams in serial.

Data that has already been processed may affect data that will be processed, according to the configuration of the trellis encoders. In more detail, since values computed using previously processed data values are stored in the internal memories, actual data streams are changed. The change in actual data may cause trouble when known data which is shared by the receiver is generated.

Accordingly, before performing trellis-encoding on the known data, the trellis encoding unit 120 may need to perform trellis-resetting to initialize the internal memories using pre-set values before the trellis-encoding operation.

The trellis encoding unit 120 may perform the initializing operation by changing some of the signals received from the MUX 110. Accordingly, actual data streams used by the trellis encoding unit 120 may differ from input streams. In other words, the trellis encoding unit 120 trellis encodes streams having parity or data areas which are changed by the RS re-encoding unit 130.

Each of the first to twelfth trellis encoders 125-1 to 125-12 may perform the trellis-resetting operation.

If the trellis-resetting operation is performed, some streams are changed.

Since the streams input to the trellis encoding unit 120 have already been RS-encoded, the data area matches the parity area. If some of the streams are changed by the trellis-resetting operation, the data area may not match the parity area.

To make up for this, the RS re-encoding unit 130 corrects at least one of the data and parity areas of the streams, and generates new codewords to match the generated codewords to an RS encoder (not shown) disposed in front of the RS re-encoding unit 130.

The parity area may be disposed in front of the data area after interleaving has been performed. In this situation, the conventional system is unable to correct the parity area even when some areas of the stream are changed by trellis-resetting, so it is impossible to compensate for the effects of trellis-resetting. Additionally, if the trellis-resetting causes the parity area to be corrected, the conventional system is also unable to compensate for the stream.

However, the RS re-encoding unit 130 may correct data or parity areas which are input following the corrected area, and may generate new codewords, so it is possible to compensate for the effects of trellis-resetting.

The corrected data may be null data or supplementary data stored in a reserved area of the stream, instead of actual data such as normal data streams or additional data streams. If the parity area is processed prior to the trellis-resetting operation, changeable data, that is input after the trellis-resetting operation but does not affect broadcast contents, may be corrected, so that the corrected data area may match the pre-processed parity area.

Additionally, it is possible to pre-design the structure of the streams in order to prevent information to be transmitted from being inserted into the area to be changed. However, a user may insert desired information into areas of the stream to be unchanged.

Accordingly, new codewords are generated. The generated codewords are transmitted to the MUX 110.

As described above, the RS re-encoding unit 130 causes the data area and parity area to be matched to each other, using an erasure decoding algorithm, and generates codewords The RS re-encoding unit 130 may know the position of the parity or data area corrected to compensate for the effects of the trellis-resetting, based on position information provided by an external source or position information computed by the RS re-encoding unit 130 itself. If the known data is distributed, position information indicating the position of parity or data areas input after the trellis-resetting operation may be obtained in advance taking into consideration the interleaving rule. Here, a separately mounted control unit (not shown) may obtain the position information. Alternatively, the position information may be provided by an external source via extra channels.

The RS re-encoding unit 130 may correct data or parities in a desired position, using the erasure decoding algorithm. The desired position may be processed in advance so as not to have actual data, as described above.

If a stream having a parity area is input, and if the input stream is partially changed, the RS re-encoding unit 130 may receive position information regarding data from an external source, and may correct the data using the position information. If there is no change in the data of the input stream, the RS re-encoding unit 130 may process the stream without needing to correct the data.

Additionally, the RS re-encoding unit 130 may correct data or parity areas of the stream according to the position of the parity area in the stream.

For example, if a parity area is disposed in front of the changed area of the stream, the RS re-encoding unit 130 may correct part or all of the data area input following the changed area of the stream. Accordingly, a codeword matching the RS encoder may be generated.

Secondly, if a parity area is disposed behind the changed area of the stream, the RS re-encoding unit 130 may correct part or all of the parity area input following the changed area of the stream. Accordingly, a new codeword matching the RS encoder may be generated.

Thirdly, if parity areas are formed in front of and behind the changed area of the stream, the RS re-encoding unit 130 may correct part or all of each of the parity area and data area. Accordingly, a codeword matching the RS encoder may be generated.

While transferring the generated codewords, namely the corrected streams, to the MUX 110, the RS re-encoding unit 130 provides the control signal to operate the MUX 110 in the second operation mode, or to operate the MUX 110 in the first operation mode. Alternatively, the control signal may be provided by the separately mounted control unit (not shown) in place of the RS re-encoding unit 130.

The stream processing apparatus of FIG. 1 may further include a map (not shown). The map may map the trellis-encoded stream output from the trellis encoding unit 120 into 8-level symbols, and output the 8-level symbols in accordance with the following Table 1.

TABLE 1

| Z2 | Z1 | Z0 | R |
|---|---|---|---|
| 0 | 0 | 0 | −7 |
| 0 | 0 | 1 | −5 |
| 0 | 1 | 0 | −3 |
| 0 | 1 | 1 | −1 |
| 1 | 0 | 0 | +1 |
| 1 | 0 | 1 | +3 |
| 1 | 1 | 0 | +5 |
| 1 | 1 | 1 | +7 |

In Table 1, Z0, Z1 and Z2 denote trellis-encoded values output from the trellis encoding unit 120, and R denotes a corresponding 8-level symbol output from the map. For example, if the trellis-encoded values Z0, Z1 and Z2 are 0, 0 and 0, respectively, the map outputs an 8-level symbol of −7.

Figure 3:
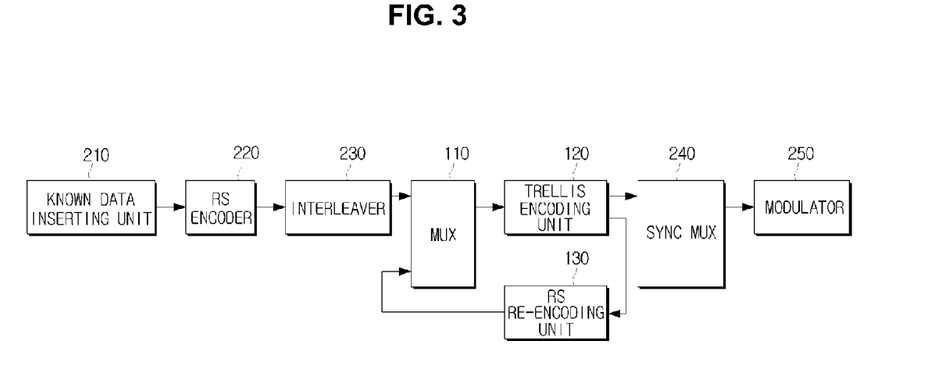
FIG. 3 is a detailed block diagram of the stream processing apparatus of FIG. 1.

FIG. 3 is a detailed block diagram of the stream processing apparatus of FIG. 1. In FIG. 3, the stream processing apparatus may include a known data inserting unit 210, an RS encoder 220, an interleaver 230, a sync MUX 240 and a modulator 250, in addition to the MUX 110, trellis encoding unit 120 and RS re-encoding unit 130.

The known data inserting unit 210 inserts known data into streams. The operation of inserting known data may be controlled by a control signal provided by the separately mounted control unit (not shown). The known data inserting unit 210 may be disposed behind the RS encoder 220 or the interleaver 230 according to the configuration of the stream processing apparatus.

The RS encoder 220 performs RS-encoding to add a parity to the stream to correct errors occurring due to channel characteristics in the transmitting operation.

The interleaver 230 performs interleaving to re-construct the RS-encoded stream according to a predetermined interleaving rule. The interleaved stream is transferred to the trellis encoding unit 120 through the MUX 110.

As described above, the trellis encoding unit 120 performs trellis-encoding on the stream output via the MUX 110 from the interleaver 230, and then performs trellis-resetting on the trellis-encoded stream at the appropriate time.

After the trellis-resetting operation, the RS re-encoding unit 130 corrects parity or data area of the stream and generates a new codeword.

The MUX 110 transmits to the trellis encoding unit 120 one of the stream output from the interleaver 230 and the stream output from the RS re-encoding unit 130 according to the operation mode.

The sync MUX 240 multiplexes a field sync signal and segment sync signal with the stream.

The modulator 250 inserts a pilot tone into the stream by adding a specific DC value to the stream that has been multiplexed with the field sync signal and segment sync signal. Additionally, the modulator 250 performs a VSB modulation of the stream by pulse-shaping the stream to obtain a VSB-modulated signal, and up-converts the VSB-modulated signal to an RF channel band signal which is then transmitted.

Figure 4:
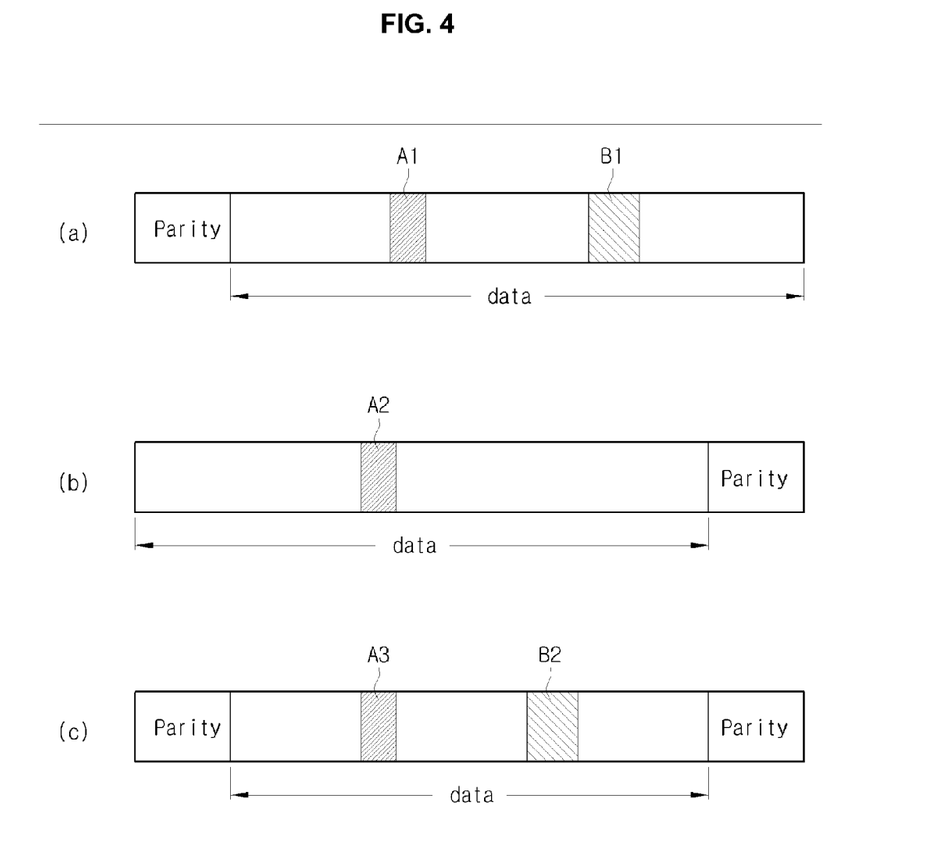
FIG. 4 illustrates an example of operations of the stream processing apparatus of FIG. 1 or 3.

FIG. 4 illustrates an example of operations of the stream processing apparatus of FIG. 1 or 3.

In FIG. 4, stream (a) contains a parity area which is disposed in front of a data area. If data corresponding to part A1 of the data area is changed by the trellis encoding unit 120, the RS re-encoding unit 130 receives position information corresponding to part B1 of the data area, and corrects data corresponding to part B1, so that a new codeword is generated to match the RS encoder 220.

In FIG. 4, stream (b) contains a parity area which is disposed behind a data area. If data corresponding to part A2 of the data area is changed by the trellis encoding unit 120, the RS re-encoding unit 130 corrects the parity area directly, so that a new codeword is generated to match the RS encoder 220.

In FIG. 4, stream (c) contains two parity areas which are disposed in front of and behind a data area, respectively. If data corresponding to part A3 of the data area is changed by the trellis encoding unit 120, the RS re-encoding unit 130 corrects data corresponding to part B2 and the two parity areas, so that a new codeword is generated to match the RS encoder 220.

Figure 5:
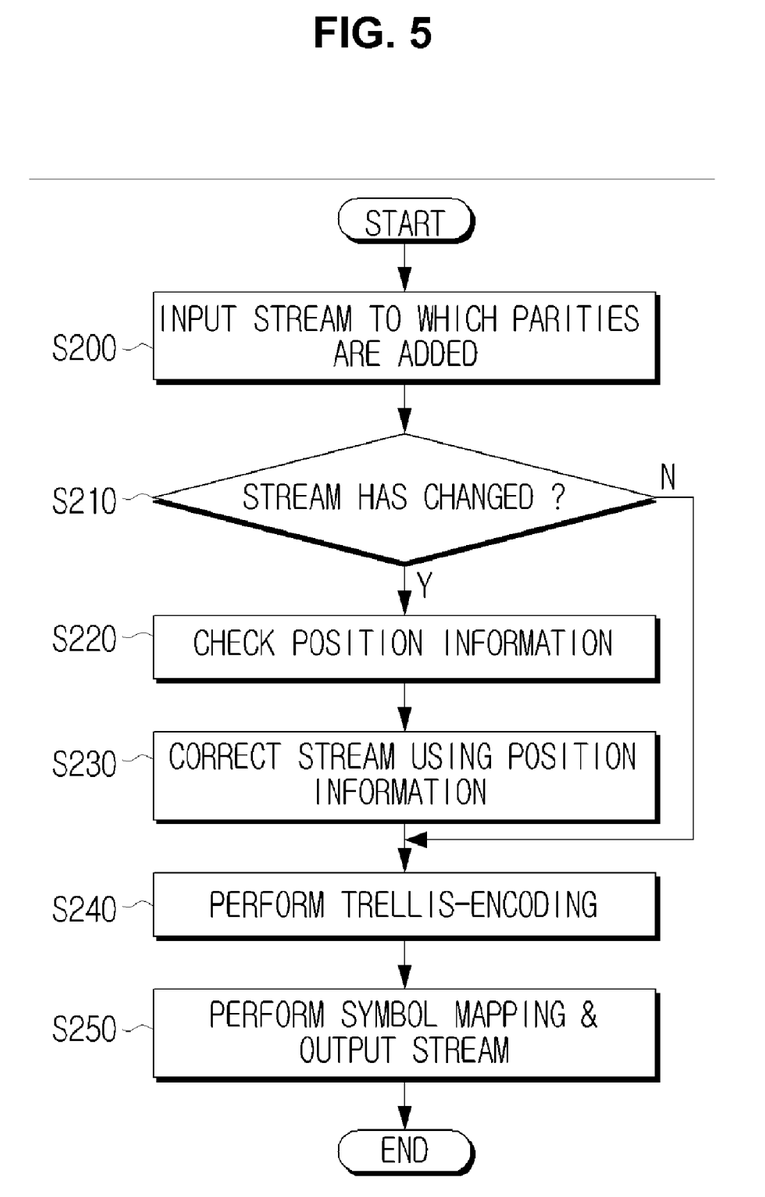
FIG. 5 is a flowchart for explaining a stream processing method according to an exemplary embodiment.

FIG. 5 is a flowchart for explaining a stream processing method according to an exemplary embodiment.

In FIG. 5, if a stream to which parities are added after randomizing, RS encoding and interleaving operations, is input (S200), the stream processing apparatus determines whether the stream has changed, namely whether trellis-resetting has been performed (S210), and checks position information regarding the position of an area of the stream required to be corrected, according to whether the stream has changed (S220). The position information may be received from an external source or may be obtained automatically by the stream processing apparatus.

If the position information is obtained, the stream corresponding to the obtained position information is corrected, so that the corrected stream matches the RS encoder (S230).

Subsequently, trellis-encoding is performed using the corrected stream (S240), and subsequent operations such as symbol mapping are then performed to output the stream (S250). The subsequent operations may include multiplexing the field sync signal and segment sync signal with the stream, inserting pilots into the stream, VSB modulation, or RF modulation.

Figure 6:
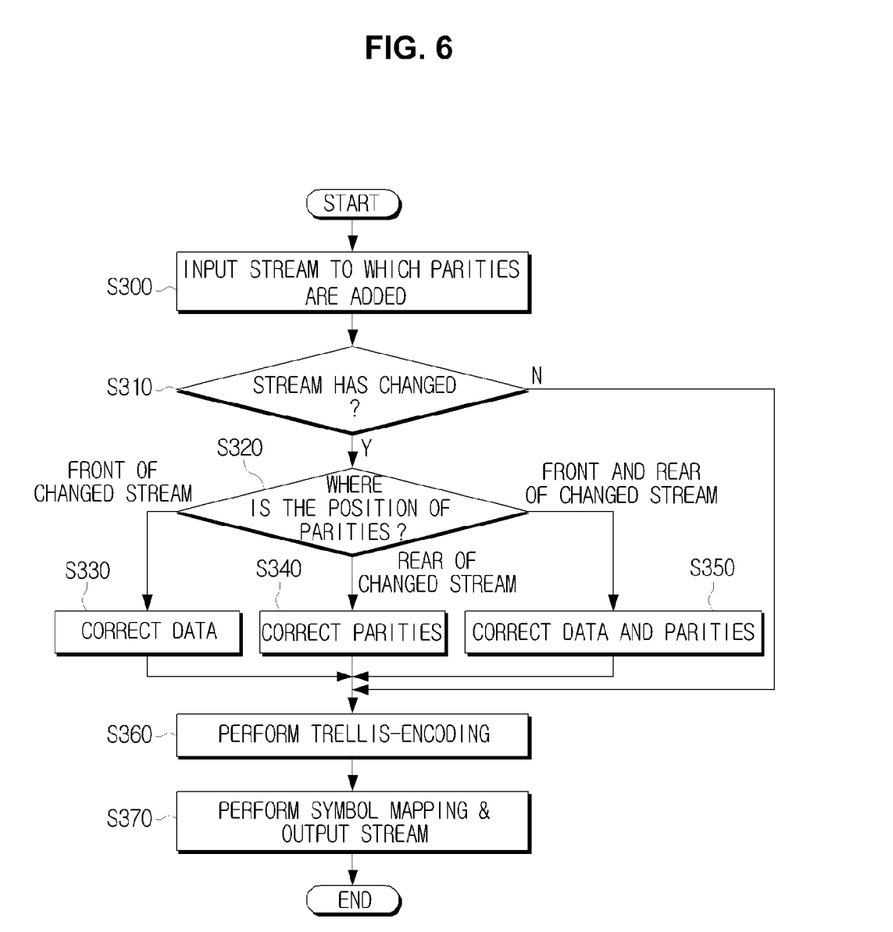
FIG. 6 is a flowchart for explaining a stream processing method according to another exemplary embodiment.

FIG. 6 is a flowchart for explaining a stream processing method according to another exemplary embodiment.

In FIG. 6, if a stream to which parities are added is input (S300), the stream processing apparatus determines whether the stream has changed, namely whether trellis-resetting has been performed (S310), in order to determine whether RS re-encoding has been performed. If it is determined that trellis-resetting has been performed, the stream processing apparatus checks the position of parities (S320). If the parities are disposed in front of the changed stream, the stream processing apparatus corrects a data area following the changed area of the stream, so that a new codeword is generated to match the RS encoder (S330).

Alternatively, if the parities are disposed behind the changed stream, the stream processing apparatus corrects the parities, so that a new codeword is generated to match the RS encoder (S340).

Additionally, if the parities are disposed in front of and behind the changed stream, respectively, the stream processing apparatus corrects at least one of the parities and data behind the changed stream, so that a new codeword is generated (S350).

Subsequently, the stream in which the parities or data are corrected, namely, the new codeword, is transmitted to the trellis encoding unit 120. In more detail, the new codeword is generated using the erasure decoding algorithm and output to the trellis encoding unit 120. The trellis encoding unit 120 performs trellis-encoding on the stream in which the parity and data are matched to each other (S360).

Subsequent operations such as symbol mapping are then performed to output the stream over a channel (S370).

The above-described components for the apparatus and method for processing streams may be partially deleted or added, or the arrangement of the components may change according to exemplary embodiments.

As described above, a stream transmitted by the digital broadcast transmitting system including the stream processing apparatus according to the exemplary embodiments may be received by a corresponding digital broadcast receiving system. Accordingly, the digital broadcast receiving system may process the stream transmitted from the stream processing apparatus in a manner corresponding to the stream processing apparatus, so it is possible to provide a user with digital broadcasting services. Additionally, it is possible to perform RS decoding while maintaining backward compatibility with an RS decoder of the digital broadcast receiving system.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

The invention claimed is:

1. An apparatus for processing streams, the apparatus comprising:
    a multiplexer (MUX) which receives a stream with parities;
    a trellis encoding unit which receives the stream with parties from the multiplexer (MUX) and changes part of the stream with parities; and
    a Reed-Solomon (RS) re-encoding unit which corrects at least one of a parity and data following the changed part of the stream, and generates a new codeword matching the changed part of the stream,
    wherein the multiplexer (MUX) receives the generated codeword from the Reed-Solomon (RS) re-encoding unit and re-constructs the stream using the generated codeword, and
    wherein at least one of the trellis encoding unit, the Reed-Solomon (RS) re-encoding unit and the multiplexer (MUX) is a hardware component.

2. The apparatus as claimed in claim 1, wherein the RS re-encoding unit generates the codeword, in which data and parity are matched to each other, using an erasure decoding algorithm.

3. The apparatus as claimed in claim 1, wherein, if the parities are disposed in front of the changed part of the stream, the RS re-encoding unit corrects part or all of the data following the changed part of the stream.

4. The apparatus as claimed in claim 1, wherein, if the parities are disposed behind the changed part of the stream, the RS re-encoding unit corrects part or all of the parities following the changed part of the stream.

5. The apparatus as claimed in claim 1, wherein, if the parities are disposed in front of and behind the changed part of the stream, the RS re-encoding unit corrects the parities and data following the changed part of the stream, and generates a codeword in which whole data and whole parity are matched to each other.

6. The apparatus as claimed in claim 1, wherein the RS re-encoding unit corrects at least one of the parity and data of the stream according to position information received from an external source or position information obtained by the RS re-encoding unit, and generates the new codeword.

7. The apparatus as claimed in claim 1, wherein the stream comprises known data.

8. The apparatus as claimed in claim 7, further comprising:
an RS encoder which performs RS encoding on the stream; and
an interleaver which performs interleaving on the RS-encoded stream and transfers the interleaved stream to the trellis encoding unit,
wherein the RS re-encoding unit generates the codeword to match the RS encoder.

9. The apparatus as claimed in claim 8, wherein the MUX transfers the stream output from the interleaver to the trellis encoding unit, and if the stream is changed, the MUX replaces a changed part of the stream with corresponding data of the generated codeword.

10. The apparatus as claimed in claim 1, wherein the Reed-Solomon (RS) re-encoding unit checks position of the parities in relation to the changed part of the stream and corrects the at least one of the parity and data following the changed part of the stream according to a result of the checking of the position of the parities.

11. A method for processing streams for transmission, the method comprising:
transferring by a multiplexer (MUX), a stream with parities;
receiving by a trellis encoding unit, the stream with parties from the multiplexer (MUX) and changing by the trellis encoding unit, a part of the stream with parities;
correcting by a Reed-Solomon (RS) re-encoding unit, at least one of a parity and data following the changed part of the stream, and generating by the Reed-Solomon (RS) re-encoding unit, a new codeword matching the changed part of the stream; and
receiving by the multiplexer (MUX), the generated codeword from the Reed-Solomon (RS) re-encoding unit and re-constructing by the multiplexer (MUX), the stream using the generated codeword.

12. The method as claimed in claim 11, wherein the correcting and generating operation comprises generating the codeword, in which data and parity are matched to each other, using an erasure decoding algorithm.

13. The method as claimed in claim 11, wherein the correcting and generating operation comprises, if the parities are disposed in front of the changed part of the stream, correcting part or all of the data following the changed part of the stream and generating the new codeword matching an RS encoder.

14. The method as claimed in claim 11, wherein the correcting and generating operation comprises, if the parities are disposed behind the changed part of the stream, correcting part or all of parities following the changed part of the stream and generating the new codeword matching an RS encoder.

15. The method as claimed in claim 11, wherein the correcting and generating operation comprises, if the parities are disposed in front of and behind the changed part of the stream, correcting the parities and data following the changed part of the stream, and generating the new codeword matching an RS encoder.

16. The method as claimed in claim 11, wherein the correcting and generating operation comprises correcting at least one of the parity and data of the stream according to position information received from an external source or position information obtained by an apparatus for processing streams, and generating the new codeword.

17. The method as claimed in claim 11, wherein the stream comprises known data.

18. The method as claimed in claim 17, further comprising:
performing Reed-Solomon (RS) encoding on the stream by an RS encoder; and
performing interleaving on the RS-encoded stream, wherein the correcting and generating operation comprises generating the codeword to match the RS encoder.

19. The method as claimed in claim 18, wherein the re-constructing operation comprises, if the stream is changed, replacing part or all of a changed part of the stream with the generated codeword.

20. The method as claimed in claim 11, wherein the method further comprises checking position of the parities in relation to the changed part of the stream, wherein the correcting of the at least one of a parity and data is performed according to a result of the checking of the position of the parities.

* * * * *